(12) United States Patent
Guo et al.

(10) Patent No.: US 12,334,181 B2
(45) Date of Patent: Jun. 17, 2025

(54) METHOD FOR CONTROLLING TEMPERATURE OF CHIPS AND RELATED CHIPS

(71) Applicant: Yangtze Memory Technologies Co., Ltd., Hubei (CN)

(72) Inventors: Xiaopei Guo, Hubei (CN); Xiaohu Zhou, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 146 days.

(21) Appl. No.: 18/185,127

(22) Filed: Mar. 16, 2023

(65) Prior Publication Data
US 2024/0282347 A1 Aug. 22, 2024

Related U.S. Application Data

(63) Continuation of application No. PCT/CN2023/076828, filed on Feb. 17, 2023.

(51) Int. Cl.
*G11C 7/04* (2006.01)
*G11C 16/34* (2006.01)

(52) U.S. Cl.
CPC .............. *G11C 7/04* (2013.01); *G11C 16/349* (2013.01)

(58) Field of Classification Search
CPC ................................ G11C 7/04; G11C 16/349
USPC ........................................................ 365/211
See application file for complete search history.

(56) References Cited

U.S. PATENT DOCUMENTS

| | | | | |
|---|---|---|---|---|
| 10,268,409 | B2 * | 4/2019 | Lee | .......................... G11C 7/04 |
| 10,282,271 | B2 * | 5/2019 | Shin | ................... G11C 11/5621 |
| 10,605,672 | B2 | 3/2020 | Walker | |
| 11,656,777 | B2 * | 5/2023 | Yoon | ..................... G06F 3/0619 |
| | | | | 711/154 |
| 2009/0287909 | A1 * | 11/2009 | Vera | ...................... G06F 11/008 |
| | | | | 702/186 |
| 2014/0278166 | A1 * | 9/2014 | Takahashi | ............ G01R 31/371 |
| | | | | 702/62 |

(Continued)

FOREIGN PATENT DOCUMENTS

| | | |
|---|---|---|
| TW | 202217817 A | 5/2022 |
| TW | 202301330 A | 1/2023 |
| WO | 2017/222606 A1 | 12/2017 |

OTHER PUBLICATIONS

Combined Taiwanese Office Action and Search Report issued on Jul. 2, 2024 in the corresponding Taiwanese Application. No. 112125745 (with English Translation of Category of Cited Documents), 7 pages.

(Continued)

*Primary Examiner* — Viet Q Nguyen
(74) *Attorney, Agent, or Firm* — Oblon, McClelland, Maier & Neustadt, L.L.P.

(57) ABSTRACT

A method for controlling a memory system is disclosed. For example, the method can include performing an operation on a memory device of the memory system, calculating a remaining payload based on a current total payload and a payload associated with the operation performed on the memory device, and when the remaining payload meets a predefined requirement, measuring a current temperature of the memory device and setting the current total payload associated with the current temperature for the memory device.

20 Claims, 4 Drawing Sheets

(56) References Cited

U.S. PATENT DOCUMENTS

| | | | |
|---|---|---|---|
| 2016/0070327 A1* | 3/2016 | Nemani | G06F 1/3206 |
| | | | 713/300 |
| 2017/0200492 A1 | 7/2017 | Yang et al. | |
| 2018/0284857 A1 | 10/2018 | Yang et al. | |
| 2020/0142799 A1 | 5/2020 | Hiruta | |
| 2022/0368149 A1* | 11/2022 | Katagiri | H01M 10/48 |
| 2023/0222042 A1* | 7/2023 | Visconti | G11C 7/222 |
| | | | 702/147 |
| 2024/0241501 A1 | 7/2024 | Guo et al. | |

OTHER PUBLICATIONS

European Search Report issued Mar. 5, 2025 in European Patent Application No. 23921583, 17 pages.

\* cited by examiner

METHOD FOR CONTROLLING TEMPERATURE OF CHIPS AND RELATED CHIPS

CROSS-REFERENCE TO RELATED APPLICATION

The present application is a continuation of International Application No. PCT/CN2023/076828, filed on Feb. 17, 2023. The entire disclosure of the prior application is hereby incorporated by reference in its entirety.

TECHNICAL FIELD

The present application describes embodiments generally related to semiconductor memory devices.

BACKGROUND

As critical dimensions of devices in integrated circuits shrink to the limits of common memory cell technologies, designers have been looking to techniques for stacking multiple planes of memory cells to achieve greater storage capacity, and to achieve lower costs per bit. A three-dimensional (3D) NAND memory device is an exemplary device of stacking multiple planes of memory cells to achieve greater storage capacity, and to achieve lower costs per bit. The 3D NAND memory device can include a stack of alternating insulating layers and word line layers over a substrate and a trench.

SUMMARY

Aspects of the present disclosure provide a method for controlling a current total payload of a memory device based on a current temperature of the memory device. For example, the method can include performing an operation on the memory device, calculating a remaining payload based on a current total payload and a payload associated with the operation performed on the memory device, and when the remaining payload meets a predefined requirement, measuring a current temperature of the memory device, and setting the current total payload associated with the current temperature of the memory device.

In an embodiment, when the remaining payload meets the predefined requirement, the method can further include starting counting a predefined amount of time, and when the remaining payload meets the predefined requirement, the method can perform measuring the current temperature of the memory device, setting the current total payload associated with the current temperature of the memory device and starting counting the predefined amount of time when the predefined amount of time is elapsed, or stopping transferring data to and/or from the memory device until the predefined amount of time is elapsed and measuring the current temperature of the memory device, setting the current total payload associated with the current temperature of the memory device and starting counting the predefined amount of time when the predefined amount of time is elapsed.

In another embodiment, the method can further include when the remaining payload does not meet the predefined requirement, performing another operation on the memory device when the predefined amount of time is not elapsed, or measuring the current temperature of the memory device, setting the current total payload associated with the current temperature of the memory device and starting counting the predefined amount of time when the predefined amount of time is elapsed.

In an embodiment, the remaining payload can be calculated by subtracting from the current total payload the payload associated with the operation performed on the memory device. In another embodiment, the current total payload associated with the current temperature for the memory device can be set based on a temperature range-current total payload relation corresponding to the memory device. In some embodiments, the predefined requirement can require that the remaining payload is less than zero.

Aspects of the present disclosure also provide a non-transitive computer readable storage medium having instructions stored therein, which, when executed by a processor, causes the processor to perform a method for controlling a memory device. Fox example, the method can include performing an operation on the memory device, calculating a remaining payload based on the current total payload and a payload associated with the operation performed on the memory device, and when the remaining payload meets a predefined requirement, measuring a current temperature of the memory device, and setting the current total payload associated with the current temperature for the memory device.

Aspects of the present disclosure further provide a memory system. For example, the memory system can include a memory device configured to store data, a temperature sensor configured to measure a current temperature of the memory device, and a memory controller coupled to the memory device and the temperature sensor. In an embodiment, the memory controller can be configured to set a current total payload associated with the current temperature of the memory device, and perform an operation on the memory device and calculate a remaining payload based on the current total payload and a payload associated with the operation performed on the memory device, wherein when the remaining payload meets a predefined requirement the memory controller sets the current total payload associated with the current temperature of the memory device.

In an embodiment, the memory system can further include a timer coupled to the memory controller, the timer being configured to count a predefined amount of time, wherein the memory controller can be further configured to control the timer to start counting the predefined amount of time when setting the current total payload associated with the current temperature of the memory device, and when the remaining payload meets the predefined requirement, the memory controller sets the current total payload associated with the current temperature of the memory device when the predefined amount of time is elapsed, or stops transferring data to and/or from the memory device until the predefined amount of time is elapsed and sets the current total payload associated with the current temperature of the memory device and controls the timer to start counting the predefined amount of time.

In another embodiment, the memory controller can be further configured to, when the remaining payload does not meet the predefined requirement, perform another operation on the memory device and calculate the remaining payload based on the current total payload and another payload associated with the another operation performed on the memory device when the predefined amount of time is not elapsed, or set the current total payload associated with the current temperature of the memory device and control the time to start counting the predefined amount of time when the predefined amount of time is elapsed.

In some embodiments, the memory controller can set the current total payload associated with the current temperature of the memory device based on a temperature range-current total payload relation. In an embodiment, the predefined requirement can require that the remaining payload is less than zero. In another embodiment, the memory device can include a cell of single-level cell (SLC) or multi-level cell (MLC) that are programmable to assume a plurality of nominal storage values. In some embodiments, the operation can be a single-level cell (SLC) read operation, an SLC write operation, an SLC erase operation, a triple-level cell (TLC) read operation, a TLC write operation or a TLC erase operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
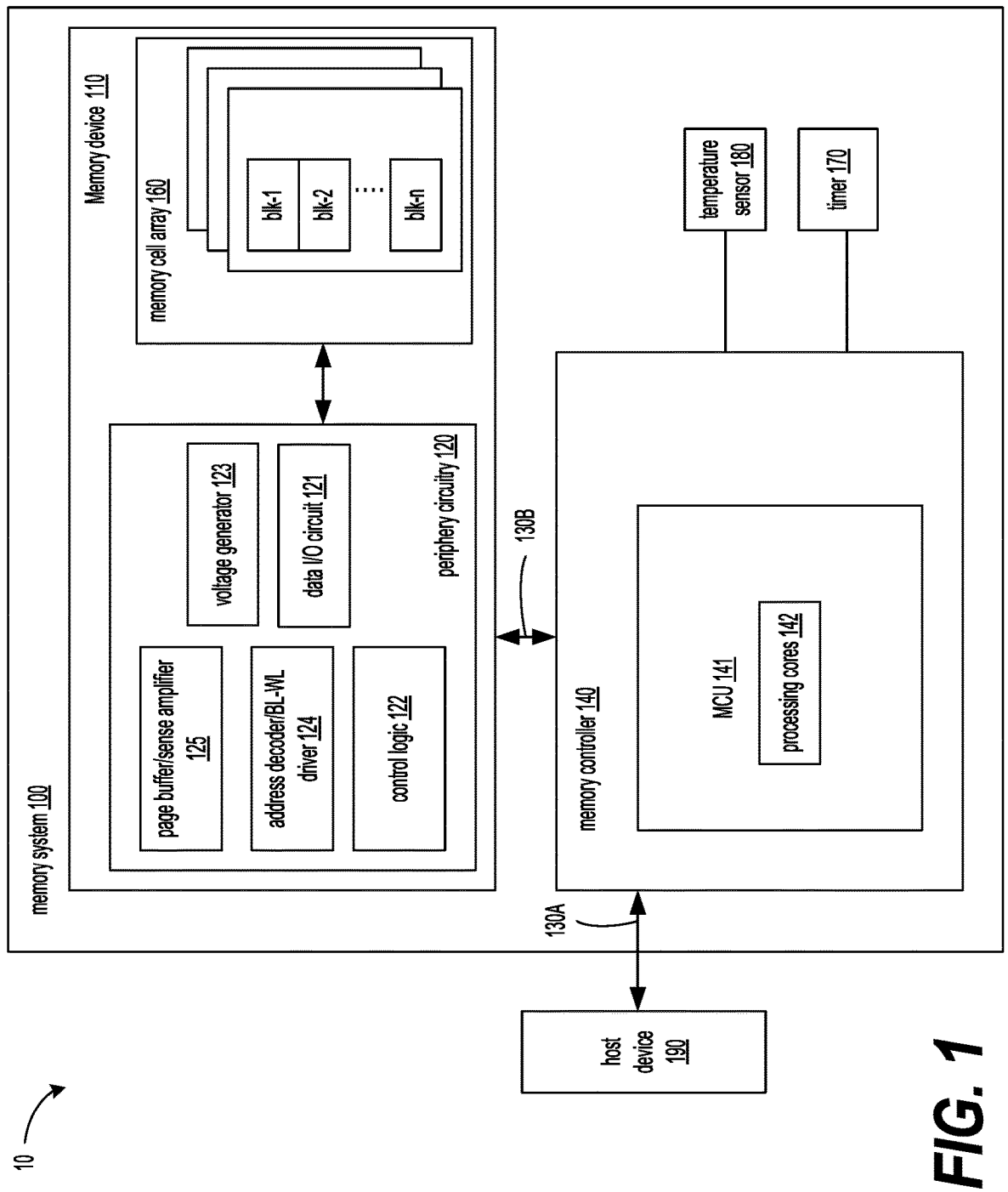
FIG. 1 is a functional block diagram of an example of a system according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a functional block diagram of an example of a system 10 according to some embodiments of the present disclosure. In an embodiment, the system 10 can include a memory system 100 and a host device 190. The system 10 can be included in an electronic device, such as a mobile phone, a virtual reality (VR), a gaming console, a wearable electronic device, a computer such as a desktop computer, a laptop computer, a tablet and a vehicle computer, or any other electronic devices. In an embodiment, the host device 190 can be a processor of an electronic device in which the system 10 is included, such as a central processing unit (CPU), or a system-on-chip (SoC), such as an application processor (AP). The host device 190 can be configured to comply with the corresponding protocols (such as NVMe, PCIe, etc.). The host device 190 further can be configured to send data to and receive data from the memory system 100, host device 190 can send instructions to memory system 100 besides the data.

Refer to FIG. 1. Memory controller 140 is coupled to memory device 110 and host device 190 and is configured to control the memory device 110, according to some implementations. Memory controller 140 can be implemented by microprocessors, microcontrollers (a.k.a. microcontroller units (MCUs) 141 includes one or more processing cores 142), central process units (CPUs), digital signal processors (DSPs), application-specific integrated circuits (ASICs), field-programmable gate arrays (FPGAs), programmable logic devices (PLDs), state machines, gated logic, discrete hardware circuits or their combinations, and other suitable hardware, firmware, and/or software configured to perform the various functions described below in detail.

Memory controller 140 can manage the data stored in memory device 110 and communicate with host device 190. In some implementations, memory controller 140 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 140 is designed for operating in a high duty-cycle environment SSDs or embedded multi-media-cards (eMMCs) used as data storage for mobile devices, such as smartphones, tablets, laptop computers, etc., and enterprise storage arrays. Memory controller 140 can be configured to control operations of memory device 110, such as read, erase, and program operations.

Memory controller 140 can communicate with an external device (e.g., host device 190) according to a particular communication protocol. For example, memory controller 140 may communicate with the external device through at least one of various interface protocols, such as a universal serial bus(USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

In some embodiments, the memory controller 140 can receive from the host device 190 write commands (also referred to as program commands), read commands, erase commands and the like, and operate corresponding operations on the memory device 110 accordingly. For example, the memory controller 140 can receive from the host device 190 a write command with an address (ADDR) and data (DATA), and then perform a write operation by storing the data in the memory device 110 at the address. As another example, the memory controller 140 can receive from the host device 190 a read command with an address, and then perform a read operation by accessing the memory device 110 and outputting data stored at the address of the memory device 110. As yet another example, the memory controller 140 can receive from the host device 190 an erase command with an address, and then perform an erase operation by resetting one or more blocks of memory cells at the address to an un-programed state (also referred to as an erased state).

Memory controller 140 can also be configured to manage various functions with respect to the data stored or to be stored in memory device 110 including, but not limited to bad-block management, garbage collection, logical-to-physical address conversion, wear leveling, etc. In some implementations, memory controller 140 is further configured to process error correction codes (ECCs) with respect to the data read from or written to memory device 110. Any other suitable functions may be performed by memory controller 140 as well, for example, formatting memory device 110.

Figure 2:
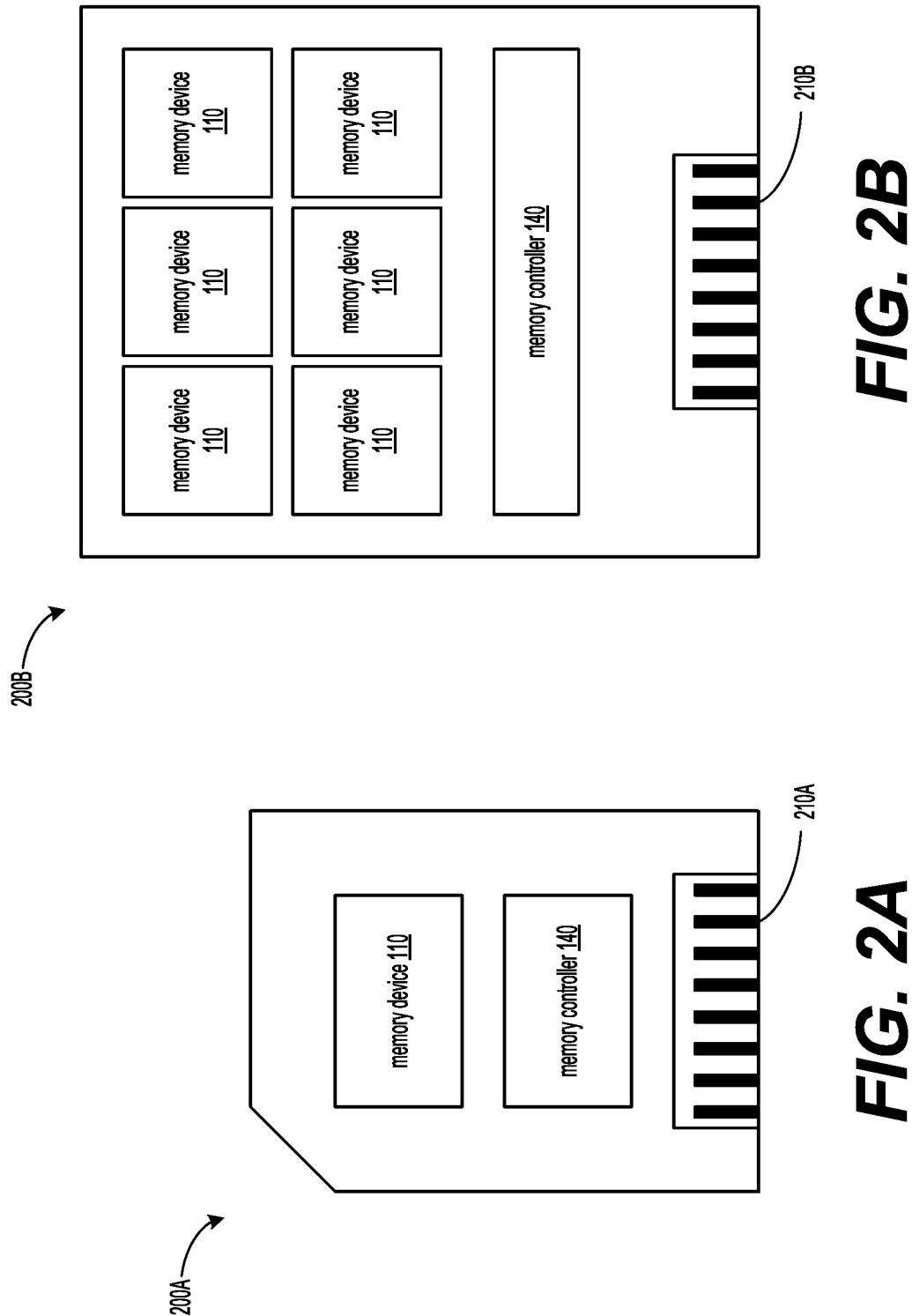
FIG. 2A is a schematic diagram of a memory card, into which a memory controller and a memory device of a memory system is integrated, according to some embodiments of the present disclosure.
FIG. 2B is a schematic diagram of a solid-state drive (SSD), into which a memory controller and multiple memory devices of the memory system is integrated, according to some embodiments of the present disclosure.

In some embodiments, the memory device 110 and the memory controller 140 can be integrated into a variety of types of storage packages, such as a universal Flash storage (UFS) or an embedded multi-media-card (eMMC), and be included into a variety of types of electronic devices. For example, the memory controller 140 and one of the memory device 110 can be integrated into a memory card 200A, as shown in FIG. 2A. The memory card 200A can include a PC card (e.g., a personal computer memory card international association (PCMCIA)), a compact Flash (CF) card, a smart media (SM) card, a memory stick, a secure digital (SD) card (e.g., SD, miniSD, microSD and SD high capacity (SDHC)), a Universal Flash Storage (UFS), etc. The memory card 200A can further include a memory card connector 210A that is used to couple the memory card 200A to a host device, e.g., the host device 190 shown in FIG. 1. As another example, memory controller 140 and more than one of the memory device 110, e.g., six memory devices 110, can be included in a solid state drive (SSD) 200B, as shown in FIG. 2B. The SSD 200B can also include an SSD connector 210B that is used to couple the SSD 200B to a host device, e.g., the host device 190 shown in FIG. 1.

In some embodiments, the memory system 100 can include memory controller 140 and memory device 110. The memory device 110 can be any type of memory devices disclosed in the present disclosure, such as an NAND memory device. In an embodiment, the memory device 110 can include a memory cell array 160 and a peripheral circuitry 120 coupled to the memory cell array 160. In some embodiments, the memory cell array 160 and the peripheral circuitry 120 can be disposed on the same die (chip). In other embodiments, the memory cell array 160 can be disposed on an array die, while the peripheral circuitry 120 can be disposed on a different die, such as a die that is implemented using complementary metal oxide-semiconductor (CMOS) technology and is referred to as a CMOS die. The array die and the CMOS die can be suitably bonded and electrically coupled to each other. In some embodiments, a CMOS die can be coupled to multiple array dies. In some embodiments, an array die can be coupled to multiple CMOS dies. In an embodiment, the memory device 110 can be an integrated circuit (IC) package that encapsulates one or more array dies and one or more CMOS dies.

Generally, the memory device 110 can include one or more memory cell arrays 160, and each of the memory cell arrays 160 can include a plurality of memory planes. Each of the plurality of memory planes can include a plurality of memory blocks, e.g., memory blocks blk-1 to blk-n. In some embodiments, concurrent operations can take place at different memory planes. In an embodiment, each of the memory blocks blk-1 to blk-n is the smallest unit to carry out an erase operation. Each of the memory blocks blk-1 to blk-n can include a number of pages. In some embodiments, page is the smallest unit that can be programmed (i.e., written to) or read.

Figure 3:
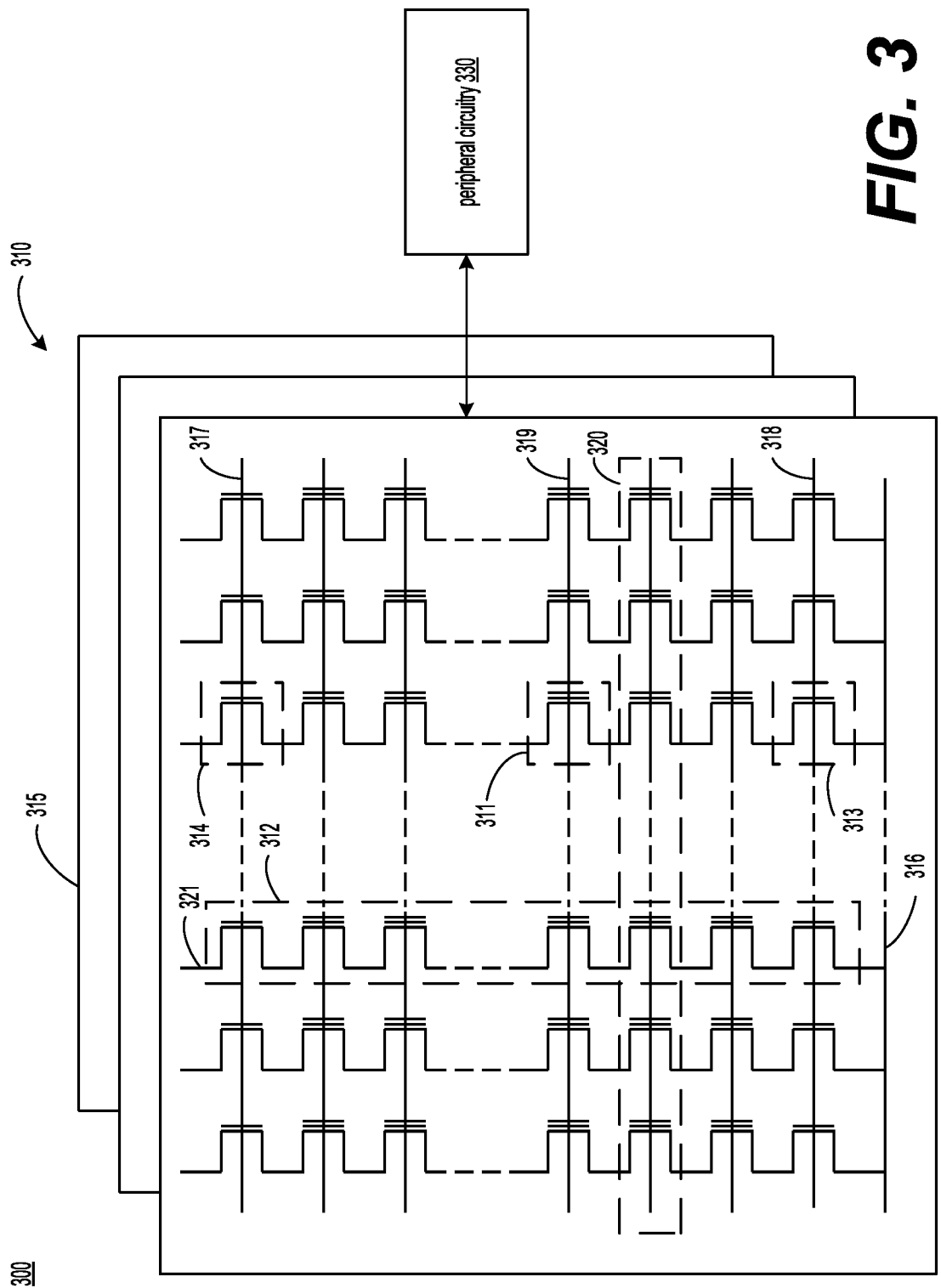
FIG. 3 is a schematic circuit diagram of an example of memory device including peripheral circuitry according to some embodiments of the present disclosure.

FIG. 3 is a schematic circuit diagram of an example of the memory device 300, e.g., the memory device 110 in FIG. 1, according to some embodiments of the present disclosure. The memory device 300 can include a memory cell array 310, e.g., the memory cell array 160 in FIG. 1, and a peripheral circuitry 330, e.g., the peripheral circuitry 120 in FIG. 1. The memory cell array 310 can include one or more memory planes, and each of the memory planes can include a plurality of memory blocks 315, e.g., the memory blocks blk-1 to blk-n in FIG. 1. The memory cell array 310 can be an NAND memory cell array in which memory cells 311 are provided in the form of an array of NAND memory strings 312 each extending vertically above a substrate (not shown). In some embodiments, each of the NAND memory strings 312 can include a plurality of the memory cells 311 coupled in series and stacked vertically over one another above the substrate. Each of the memory cells 311 can hold a continuous, analog value, such as an electrical voltage or charge, that depends on the number of electrons trapped within a region of the memory cell 311. Each of the memory cells 311 can be either a floating gate type of memory cell including a floating-gate transistor or a charge trap type of memory cell including a charge-trap transistor.

In some embodiments, each of the memory cells 311 can be a single-level cell (SLC) that has two possible memory states, and thus can store one bit of data. For example, the first memory state "0" can correspond to a first range of voltages, and the second memory state "1" can correspond to a second range of voltages. In some embodiments, each of the memory cells 311 can be a multi-level cell (MLC) that is capable of storing at least two bits of data in more than four memory states. For example, the MLC can store two bits per cell (also known as double-level cell (DLC)), three bits per cell (also known as triple-level cell (TLC)), or four bits per cell (also known as a quad-level cell (QLC)). Each MLC can be programmed to assume a range of possible nominal storage values. For example, a DLC can be programmed to assume one of three possible programming levels from an erased state by writing one of three possible nominal storage values to the memory cell. A fourth nominal storage value can be used for the erased state. In an embodiment, an MLC can also be programmed to assume only one programming level from an erased state by writing a possible nominal storage value (e.g., a first nominal storage value) to the memory cell, and a second nominal storage value can be used for the erased state. For example, a TLC, though being capable of storing three bits, can be programmed to assume only one programming level from an erased state by writing a possible nominal storage value (e.g., a first nominal storage value) to the memory cell, and a second nominal storage value can be used for the erased state.

Each of the NAND memory strings 312 can include a source select gate (SSG) 313 at its source end and a drain select gate (DSG) 314 at its drain end. The SSGs 313 and the DSGs 314 can be configured to activate selected NAND memory strings 312 (i.e., columns of the memory cell array 310) during read and program operations. In some embodiments, the sources of the NAND memory strings 312 in the same block 315 can be coupled through the same source line (SL) 316, e.g., a common SL. In other words, all of the NAND memory strings 312 in the same block 315 have an array common source (ACS), according to some embodiments. In some embodiments, the DSG 314 of each of the NAND memory strings 312 can be coupled to a respective bit line 321 from which data can be read from or written into the NAND memory string 312 via an output bus (not shown). In some embodiments, each of the NAND memory strings 312 can be configured to be selected or deselected by applying a select voltage (e.g., above the threshold voltage of the transistor having the DSG 314) or a deselect voltage (e.g., 0 V) to respective DSG 314 through one or more DSG lines 317 and/or by applying a select voltage (e.g., above the threshold voltage of the transistor having the SSG 313) or a deselect voltage (e.g., 0 V) to respective SSG 313 through one or more SSG lines 318.

The NAND memory strings 312 can be organized into multiple blocks 315, each of which can have the common source line (SL) 316, e.g., coupled to the ACS. In some embodiments, each of the blocks 315 is the basic data unit for erase operations, i.e., all of the memory cells 311 on the same block 315 shall be erased at the same time. To erase the memory cells 311 in a selected block 315, the source lines (SL) 316 coupled to the selected block 315 as well as unselected blocks 315 that are in the same plane as the selected block 315 can be biased with an erase voltage, such as a high positive voltage (e.g., 20 V or more). It is understood that in some embodiments, an erase operation may be performed at a half-block level, a quarter-block level, or a level having any suitable number of blocks or any suitable fractions of a block. The memory cells 311 of adjacent NAND memory strings 312 can be coupled through word lines 319 that select which row of the memory cells 311 shall be affected by read and program operations. In some embodiments, each of the word lines 319 can be coupled to a page 320 of the memory cells 311, which is the basic data unit for program operations. The size of one page 320 in bits can relate to the number of NAND memory strings 312 coupled by the word line 319 in one block 315. For ease of description, the memory cells 311 in one page 320 may be coupled to the same word line 319, and the terms "page" and "word line" may be used interchangeably in the present disclosure. It is understood that, however, in some embodiments, the memory cells 311 in one page 320 may be coupled to more than one word lines 319. Each of the word lines 319 can include a plurality of control gates (or gate electrodes) (not shown) at each of the memory cells 311 in respective page 320 and a gate line (not shown) coupling the control gates.

Refer back to FIG. 1, in some embodiments, the memory device 110 can include peripheral circuitry 120 that can be coupled to memory cell array 160 through bit lines 321, word lines 319, source lines 316, SSG lines 318, and DSG lines 317. Peripheral circuitry 120 can include any suitable analog, digital, and mixed-signal circuits for facilitating the operations of memory cell array 160 by applying and sensing voltage signals and/or current signals to and from each target (select) memory cell 311 through bit lines 321, word lines 319, source lines 316, SSG lines 318, and DSG lines 317. Peripheral circuitry 120 can include various types of peripheral circuitry formed using metal-oxide-semiconductor (MOS) technologies. For example, as shown in FIG. 1, peripheral circuitry 120 can include an I/O circuit 121, a control logic 122, a page buffer/sense amplifier 125, an address decoder/BL-WL driver 124, a voltage generator 123. Control logic 122 can be coupled to each peripheral circuitry described above and configured to control the operations of each peripheral circuitry. It is understood that in some examples, additional peripheral circuitry not shown in FIG. 1 may be included as well.

124125121123122In some embodiments, the address decoder/BL-WL driver 124 can be coupled to the memory cell array 160. The address decoder/BL-WL driver 124 can include column decoder and row decoder. The column decoder can be connected to the memory cell array 160 via bit lines 321, and may select bit lines based on column addresses. The column decoder can be configured to be controlled by control logic 122 and select one or more NAND memory strings 312 by applying bit line voltages generated from voltage generator 123. The row decoder may be connected to the memory cell array 160 via word lines, and may select word lines based on row addresses. Row decoder can be configured to be controlled according to the control signals by control logic 122 and select/unselect memory blocks 315 of memory cell array 160 and select/unselect word lines 319 of memory block 315. Row decoder can be further configured to drive word lines 319 using word line voltages generated from voltage generator 123. In some implementations, row decoder can also select/unselect and drive SSG lines 318, and DSG lines 317 as well using SSG voltages and DSG voltages generated from voltage generator 123.124124124In some embodiments, during a write operation the address decoder/BL-WL driver 124 can provide word line (WL) signals and the select signals to the memory cell array 160 to select a page to program. During a read operation, the address decoder/BL-WL driver 124 can provide the WL signals and the select signals to select a page for buffering. During an erase operation, the address decoder/BL-WL driver 124 can provide the WL signals and the select signals to select a block to erase.

The page buffer/sense amplifier 125 can be coupled to the memory cell array 160 via the bit lines 321 and configured to can be configured to read and program (write) data from and to memory cell array 160 according to the control signals from control logic 122. The page buffer/sense amplifier 125 can be configured to buffer data, such as one or more pages of data during read and write operations. In an embodiment, during a write operation (program operation) the page buffer/sense amplifier 125 can buffer data to be programed and drive the data to the bit lines 321 of the memory cell array 160 to write the data into the memory cell array 160. During the write operation the page buffer/sense amplifier 125 can sense the signals (e.g., current) from bit line 321 to verify whether the data has been properly programmed into target memory cells 311 coupled to select word lines 319. In another embodiment, during a read operation the page buffer/sense amplifier 125 can sense the low power signals (e.g., current) from bit line 321 that represents a data bit stored in memory cell 311 and amplify the small voltage swing to recognizable logic levels.

In the FIG. 1 example, in an embodiment, the I/O circuit 121 is coupled to control logic 122 and act as a control buffer to buffer and relay control commands (e.g., program command) received from a memory controller 140 to control logic 122 and status information received from control logic 122 to the memory controller 140. In another embodiment, the I/O circuit 121 can also be coupled to the address decoder/BL-WL driver 124 and act as a data I/O interface and a data buffer to buffer and relay the data to and from memory cell array 160.125 121125 121

In some embodiments, the memory system 100 may include memory device 110 comprising I/O circuit. The I/O circuit can be coupled to the external device, e.g., host device. The external device implement the function of the memory controller described above. The external device can send commands to the memory device via the I/O circuit. The external device can send data to and receive data from the memory device via the I/O circuit. The external device can receive from the memory device a signal generated by the memory device in response to a command sent by the external device.

The voltage generator 123 can be configured to be controlled by control logic 122 and configured to generate voltages of suitable levels for the proper operations of memory device 110. For example, during a read operation the voltage generator 123 can generate voltages of suitable levels for source voltages, various word line (WL) voltages, select voltages and the like that are suitable for the read operation. In some embodiments, during the read operation the source voltages can be provided as array common source (ACS) voltages to the source line 316. The WL voltages, the select voltages can be provided to the address decoder/BL-WL driver 124, and the address decoder/BL-WL driver 124 can thus output the WL signals and the select signals (e.g., TSG signals and BSG signals) at the suitable voltage level during the read operation.

In another embodiment, during an erase operation the voltage generator 123 can generate voltages of suitable levels for source voltages, WL voltages, select voltages, BL voltages and the like that are suitable for the erase operation. In some embodiments, during the erase operation the source voltage can be provided as ACS voltages to the source lines 316. The WL voltages and the select voltages can be provided to the address decoder/BL-WL driver 124, and the address decoder/BL-WL driver 124 can thus output the WL signals and the BSG and TSG signals at the suitable voltage level during the erase operation. The BL voltages can be provided to the page buffer/sense amplifier 125, and the page buffer/sense amplifier 125 can thus drive the bit lines (BL) at proper voltage level during the erase operation. In some embodiment, the BL voltage may be applied directly to the bit lines, without going through the page buffer/sense amplifier 125.

125121123123. 1221221221221222As the operations, e.g., read, write and erase operations, etc., are performed one by one or in parallel on the memory device 110 continuously, power will be consumed and, accordingly, a temperature of the memory device 110 will keep rising. The temperature, if rising over a threshold, may impact the operations of or even cause damages to the memory system 100. To address this issue, the frequency of the operations performed on the memory device 110 can be reduced whenever the temperature of the memory device 110 exceeds the threshold. However, the reduction of frequency may cause temperature jitter to the memory device 110.

According to the present disclosure, a plurality of temperature ranges can be defined, each of which can correspond to a current total payload. A current temperature of the memory device 110 can be measured, and one of the current total payloads can be selected that corresponds to one of the temperature ranges within which the current temperature falls. In some embodiments, payloads of one or more operations that are to be performed on the memory device 110 are not allowed to exceed the current total payload.

Figure 4:
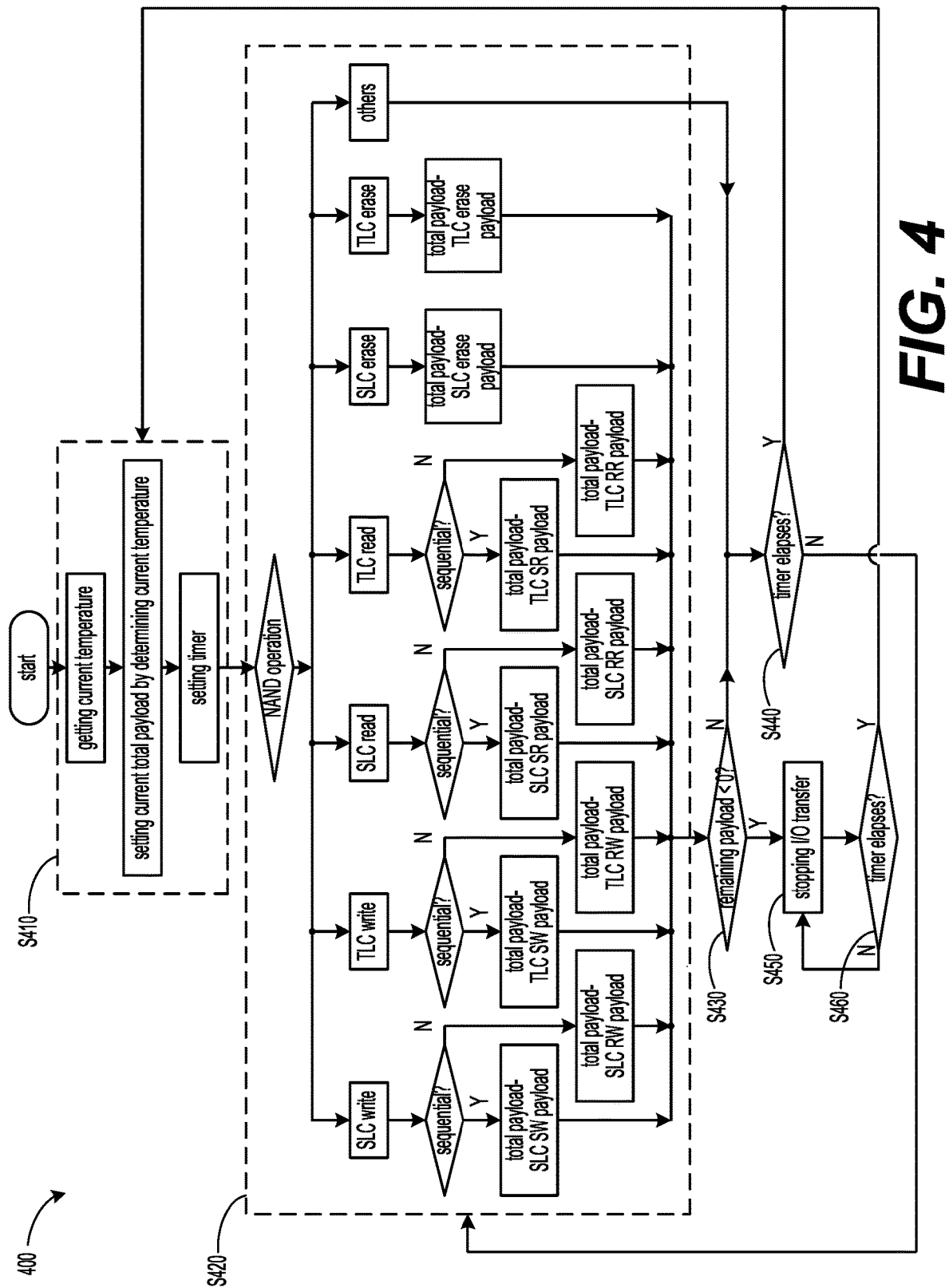
FIG. 4 is a flow chart of an example of a method for controlling a current total payload of a memory device based on a current temperature of the memory system, in accordance with some embodiments of the present disclosure.

FIG. 4 is a flow chart of an exemplary method 400 for controlling a current total payload of a memory device based on a current temperature of the memory device, in accordance with some embodiments of the present disclosure. It should be understood that the process steps shown in the method 400 are not exhaustive and that other process steps can be performed as well before, after, or between any of the illustrated process steps. In some embodiments, some process steps of the exemplary method 400 can be omitted or other process steps can be included, which are not described here for simplicity. In some embodiments, process steps of the method 400 can be performed in a different order and/or vary. In an embodiment, the method 400 can be implemented in the memory system 100 shown in FIG. 1.

The method 400 starts at step S410, at which a current temperature Ta of the memory device can be measured. For example, the memory system 100 further includes a temperature sensor 180 coupled to the memory controller 140. The memory controller 140 can obtain the temperature of the memory device 110 from the current temperature sensor 180, or control the temperature sensor 180 to measure and get the current temperature of the memory device 110. In an embodiment, the temperature sensor 180 may be included in the memory device 110 to sense or measure the current temperature of the memory device 110. In other embodiment, the temperature sensor 180 may be included in the memory controller 140 to sense or measure the current temperature of the memory device 110. In another embodiment, the temperature sensor 180 may be included in the memory system 100 to sense or measure the current temperature of the memory device 110.

Also at step S410, a current total payload of the memory device can be set by determining the current temperature Ta. For example, the memory controller 140 can set the current total payload of the memory device, which is associated with the current temperature, based on a temperature range-current total payload relation listed Table 1 as follows, which can be associated with the characteristics of the memory device and be obtained at least by experiments and simulation:

TABLE 1

| No. | temperature range | current total payload |
| --- | --- | --- |
| $1^{st}$ | Ta < 83° C. | A |
| $2^{nd}$ | 83° C. <= Ta < 93° C. | $\alpha_1$A, e.g., 0.7 A |
| $3^{rd}$ | 93° C. <= Ta < 103° C. | $\alpha_2$A, e.g., 0.3 A |
| $4^{th}$ | Ta >= 103° C. | $\alpha_3$A, e.g., 0.05 A |

For example, when the current temperature Ta falls within a first temperature range, the lowest one of the temperature ranges, e.g., less than 83° C., the current total payload can be set to be A, which is the maximal total payload that is allowed for the performing of operations to consume without causing the temperature of the memory device to exceed the threshold. As another example, some operations have been performed on the memory device and the current temperature Ta may rise and fall within a second temperature range (e.g., between 83° C. and 93° C.), which indicates that the current temperature Ta is more closer to the threshold and a smaller current total payload, i.e., $\alpha_1$A, where $0<\alpha_1<1$, e.g., 0.7, shall be set in order to ensure that the performing of the operations on the memory device will not cause the temperature of the memory device to exceed the threshold. As more operations have been performed on the memory device and the current temperature may further rise and fall within a third temperature range, e.g., between 93° C. and 103° C., a further smaller current total payload, i.e., $\alpha_2 A$, where $0<\alpha_2<\alpha_1$, e.g., 0.3, shall be set. When the current temperature of the memory device is pretty close to the threshold, e.g., falling within a fourth temperature range (e.g., greater than 103° C.), an even further smaller current total payload, i.e., $\alpha_3 A$, where $0<\alpha_3<\alpha_2$, e.g., 0.05, shall be set, thus allowing only a very limited number of operations to be further performed on the memory device.

Also at step S410, a timer can be set. For example, the memory system 100 further comprises a timer 170 coupled to the memory controller 140. In some embodiments, the timer 170 can be included in the memory controller 140 and coupled to the MCU 141 of the memory controller 140. In other embodiments, the timer 170 can be included in the memory system 100 and coupled to the MCU 141 of the memory controller 140. The MCU 141 can control the timer 170 to start counting a predefined amount of time, e.g., 500 µs. In some embodiments, the MCU 141 can set the timer 170 periodically. For example, when the predefined amount of time elapses, the MCU 141 sets the timer 170 again.

At step S410, the current temperature, the current total payload and the timer can be measured and set in an order different from that shown in FIG. 4. For example, first, the memory controller 140 can set the timer 170. Then, the memory controller 140 can obtain the current temperature of the memory device according to measurement result of the temperature sensor 180. And then, the memory controller 140 set the current total payload by determining the current temperature based on the temperature range-current total payload relation. The method 400 then proceeds to step S420.

At step S420, operations can be performed on the memory device one by one or in parallel continuously. For example, the memory controller 140 can receive operation commands from the host device 190 via the host interface 130A and send the operation commands to the memory device 110 to perform the operations on the memory device 110 via the array interface 130B. In an embodiment, the memory device can be any type of memory devices disclosed in the present disclosure, such as an NAND memory device. Operations of the NAND memory device can include a read operation, a write (or program) operation, an erase operation, and others, such as operations performed under get features commands and set features commands, and the read/write operations can include random and sequential read/write operations. In an embodiment, the NAND memory device can be an MLC, e.g., TLC, NAND memory device, and the TLC NAND memory device can be programmed to function as a TLC and SLC NAND memory device. In some embodiments, these operations may correspond to different payloads, as listed in Table 2 as follows:

TABLE 2

| NAND operation | Detailed information | Power | Payload |
|---|---|---|---|
| SLC random read | Page Read current on Vcc | $P_{PR}$ | $PL_{SLCRR}$ |
| | I/O Burst Read current for Vcc | $P_{BR1}$ | |
| | I/O Burst Read current for Vccq | $P_{BR2}$ | |
| SLC sequential read | Page Read current on Vcc | $P_{PR}$ | $PL_{SLCSR}$ |
| | I/O Burst Reade current for Vcc | $P_{BR1}$ | |
| | I/O Burst Read current for Vccq | $P_{BR2}$ | |
| SLC sequential write | Page Program current on Vcc | $P_{PP}$ | $PL_{SLCSW}$ |
| | I/O Burst Write current for Vcc | $P_{BW1}$ | |
| | I/O Burst Write current for Vccq | $P_{BW2}$ | |

TABLE 2-continued

| NAND operation | Detailed information | Power | Payload |
|---|---|---|---|
| SLC erase | Erase current on Vcc | $P_E$ | $PL_{SLCE}$ |
| TLC random read | Page Read current on Vcc | $P_{PR}$ | $PL_{TLCRR}$ |
| | I/O Burst Read current for Vcc | $P_{BR1}$ | |
| | I/O Burst Read current for Vccq | $P_{BR2}$ | |
| TLC sequential read | Page Read current on Vcc | $P_{PR}$ | $PL_{TLCSR}$ |
| | I/O Burst Read current for Vcc | $P_{BR1}$ | |
| | I/O Burst Read current for Vccq | $P_{BR2}$ | |
| TLC sequential write | Page Program current on Vcc | $P_{PP}$ | $PLT_{TLCSW}$ |
| | I/O Burst Write current for Vcc | $P_{BW1}$ | |
| | I/O Burst Write current for Vccq | $P_{BW2}$ | |
| TLC erase | Erase current on Vcc | $P_E$ | $PL_{TLCE}$ |

For example, SLC random read operation includes some sub-operations, and the payload $PL_{SLCRR}$ associated with the SLC random read operation can involve page read current on Vcc, I/O burst read current on Vcc and I/O burst read current for Vccq. As another example, TLC sequential write operation also includes some sub-operations, and the payload $PL_{TLCSW}$ associated with the TLC sequential write operation can involve page program current on Vcc, I/O burst write current on Vcc and I/O burst write current for Vccq. The payload of each of the operations can be associated with the characteristics of the memory device and be obtained at least by experiments and simulation.

At step S430, a remaining payload can be calculated by subtracting from the current total payload a payload that is associated with the operation performed on the memory device at step S420, and whether the remaining payload is less than zero can be determined. For example, the memory controller 140 can subtract the payload associated with the operation just performed on the memory device, e.g., SLC random read, TLC sequential write and TLC erase, from the current total payload to obtain the remaining payload, and determine whether the remaining payload is less than zero. If it is determined that the remaining payload is less than zero, the method 400 proceeds to step S440, or the method 400 proceeds to step S450.

In some embodiments, at step S430 whether the remaining payload is less than another payload associated with another operation to be performed on the memory device can be determined, instead of determining whether the remaining payload is less than zero. If it is determined that the remaining payload is less than the another payload associated with the another operation to be performed on the memory device, the method 400 proceeds to step S440, or the method 400 proceeds to step S450.

In the example embodiment shown in FIG. 4, as some operations, such as operations performed under get features commands and set features commands, consume much less power, compared with the operations, and the decrease of the remaining payload due to the performing of these operations is thus very small and step S430 can be skipped, the "other" block at step S420 being thus linked to step S440 directly.

At step S440, whether the predefined amount of time elapses can be determined. The method 400 proceeding to step S440 indicates that the remaining payload is not less than zero, and more operations can be allowed to be further performed on the memory device. If it is determined that the predefined amount of time does not elapse, the method 400 returns to step S420 for more operations to be further performed on the memory device. If it is determined that the predefined amount of time elapses, the method 400 returns to step S410, at which the current temperature of the memory device is measured, the current total payload is set by determining the current temperature based on the temperature range-current total payload relation, and the timer is set to start counting the predefined amount of time, even though the remaining payload is not less than zero or the remaining payload is not less than the another payload associated with the another operation to be performed on the memory device.

At step S450, I/O transferring of data can be stopped. The method 400 proceeding to step S450 indicates that the remaining payload is less than zero and no more operation is allowed to be performed on the memory device, so the memory controller 140 can stop the transferring of data to and from the memory device. The method then proceeds to step S460.

At step S460, whether the predefined amount of time elapses can be determined. If it is determined that the predefined amount of time does not elapse, the method 400 proceeds to step S450, at which I/O transferring of data still stops. If it is determined that the predefined amount of time elapses, the method 400 returns to step S410, at which the current temperature of the memory device is measured, the current total payload is set by determining the current temperature based on the temperature range-current total payload relation, and the timer is set to start counting the predefined amount of time.

According to the present disclosure, a current total payload of a memory device can be set by determining a current temperature of the memory device based on a temperature range-current total payload relation that include a plurality of temperature range and current total payload pairs. The temperature range-current total payload relation can be determined based on the characteristics of the memory device at least by experiments and simulations. Therefore, the temperature of the memory device can be controlled granularly, without rising or falling abruptly, and the temperature jitter can be lessened.

According to the present disclosure, a non-transitive computer readable storage medium is disclosed. In some embodiments, the non-transitive computer readable storage medium can have instructions stored therein, which, when executed by a processor, e.g., the memory controller 140, causes the processor to perform a method, e.g., the method 400, which may include the following steps: (a) measuring a current temperature of a memory device, e.g., the memory system 100, setting a current total payload associated with the current temperature of the memory device based on a temperature range-current total payload relation corresponding to the memory device, e.g., the temperature range-current total payload relation listed in Table 1, and starting counting a predefined amount of time; (b) performing an operation on the memory device, e.g., read, write and erase operations; (c) calculating a remaining payload by subtracting from the current total payload a payload associated with the operation performed on the memory device; (d) when the remaining payload meets a predefined requirement, e.g., the remaining payload less than zero or the remaining payload less than another payload associated with another operation to be performed on the memory device, (d1) returning to step (a) when the predefined amount of time is elapsed, or (d2) stopping transferring data to and/or from the memory device until the predefined amount of time is elapsed and returning to step (a); and (e) when the remaining payload does not meet the predefined requirement, (e1) returning to step (b) when the predefined amount of time is not elapsed, or (e2) returning to step (a) when the predefined amount of time is elapsed.

According to the present disclosure, the term "non-transitory," as used herein, is a limitation of the medium itself (i.e., tangible, not a signal) as opposed to a limitation on data storage persistency (e.g., RAM vs. ROM).

According to the present disclosure, a memory system, e.g., the memory system 100, is also disclosed. In some embodiments, the memory system can include a memory device, e.g., the memory device 110, configured to store data, a temperature sensor, e.g., the temperature sensor 180, configured to measure a current temperature of the memory device, and a memory controller, e.g., the memory controller 140, coupled to the memory device and the temperature sensor. In an embodiment, the memory controller can be configured to (a) set a current total payload associated with the current temperature of the memory device, and (b) perform an operation on the memory device and calculate a remaining payload based on the current total payload and a payload associated with the operation performed on the memory device. In some embodiments, when the remaining payload meets a predefined requirement, e.g., requiring that the remaining payload is less than zero, the memory controller can does (a).

In an embodiment, the memory system can further include a timer coupled to the memory controller. The timer can be configured to count a predefined amount of time. In some embodiments, the memory controller can be further configured to control the timer to start counting the predefined amount of time when doing (a), and when the remaining payload meets the predefined requirement, the memory controller can do (a) when the predefined amount of time is elapsed, or stop transferring data to and/or from the memory device until the predefined amount of time is elapsed and do (a).

In an embodiment, the memory controller can be further configured to, when the remaining payload does not meet the predefined requirement, do (b) when the predefined amount of time is not elapsed, or do (a) when the predefined amount of time is elapsed. In another embodiment, the memory controller can calculate the remaining payload by subtracting from the current total payload the payload associated with the operation performed on the memory device. In some embodiments, the memory controller can set the current total payload associated with the current temperature for the memory device based on a temperature range-current total payload relation. In various embodiments, the predefined requirement can require that the remaining payload is less than zero. In an embodiment, the memory device can include an array of single-level cells (SLCs) or multi-level cells (MLCs) that are programmable to assume a plurality of nominal storage values. In another embodiment, the operation can be a single-level cell (SLC) read operation, an SLC write operation, an SLC erase operation, a multi-level cell (MLC) read operation, e.g. a triple-level cell (TLC) read operation, a MLC write operation, e.g. TLC write operation, or a MLC erase operation, e.g. TLC erase operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for controlling a memory system comprises a memory device, comprising:
   performing an operation on the memory device;
   calculating a remaining payload based on a current total payload and a payload associated with the operation performed on the memory device; and
   when the remaining payload meets a predefined requirement, measuring a current temperature of the memory device and setting the current total payload associated with the current temperature of the memory device.

2. The method of claim 1, wherein when the remaining payload meets the predefined requirement, the method further comprises starting counting a predefined amount of time, and
   wherein when the remaining payload meets the predefined requirement, the method performs measuring the current temperature of the memory device, setting the current total payload associated with the current temperature of the memory device and starting counting the predefined amount of time when the predefined amount of time is elapsed, or stopping transferring data to and/or from the memory device until the predefined amount of time is elapsed and measuring the current temperature of the memory device, setting the current total payload associated with the current temperature of the memory device and starting counting the predefined amount of time when the predefined amount of time is elapsed.

3. The method of claim 2, further comprising:
   when the remaining payload does not meet the predefined requirement, performing another operation on the memory device when the predefined amount of time is not elapsed, or measuring the current temperature of the memory device, setting the current total payload associated with the current temperature of the memory device and starting counting the predefined amount of time when the predefined amount of time is elapsed.

4. The method of claim 1, wherein the remaining payload is calculated by subtracting from the current total payload the payload associated with the operation performed on the memory device.

5. The method of claim 1, wherein the current total payload associated with the current temperature of the memory device is set based on a temperature range-current total payload relation corresponding to the memory device.

6. The method of claim 1, wherein the predefined requirement requires that the remaining payload is less than zero.

7. A non-transitive computer readable storage medium having instructions stored therein, which, when executed by a processor, causes the processor to perform a method for controlling a memory system comprises a memory device, the method comprising:
   performing an operation on the memory device;
   calculating a remaining payload based on a current total payload and a payload associated with the operation performed on the memory device; and
   when the remaining payload meets a predefined requirement, measuring a current temperature of the memory device and setting the current total payload associated with the current temperature of the memory device.

8. The non-transitive computer readable storage medium of claim 7, wherein when the remaining payload meets the predefined requirement, the method further comprises starting counting a predefined amount of time, and
   wherein when the remaining payload meets the predefined requirement, the method performs measuring the current temperature of the memory system, setting the current total payload associated with the current temperature of the memory system and starting counting the predefined amount of time when the predefined amount of time is elapsed, or stopping transferring data to and/or from the memory device until the predefined amount of time is elapsed and measuring the current temperature of the memory system, setting the current total payload associated with the current temperature of the memory system and starting counting the predefined amount of time when the predefined amount of time is elapsed.

9. The non-transitive computer readable storage medium of claim 8, further comprising:
   when the remaining payload does not meet the predefined requirement, performing another operation on the memory device when the predefined amount of time is not elapsed, or measuring the current temperature of the memory device, setting the current total payload associated with the current temperature of the memory device and starting counting the predefined amount of time when the predefined amount of time is elapsed.

10. The non-transitive computer readable storage medium of claim 7, wherein the remaining payload is calculated by subtracting from the current total payload the payload associated with the operation performed on the memory device.

11. The non-transitive computer readable storage medium of claim 7, wherein the current total payload associated with the current temperature of the memory device is set based on a temperature range-current total payload relation corresponding to the memory device.

12. The non-transitive computer readable storage medium of claim 7, wherein the predefined requirement requires that the remaining payload is less than zero.

13. A memory system, comprising:
   a memory device configured to store data;
   a temperature sensor configured to measure a current temperature of the memory device; and
   a memory controller coupled to the memory device and the temperature sensor, the memory controller configured to set a current total payload associated with the current temperature of the memory device, and perform an operation on the memory device and calculate a remaining payload based on the current total payload and a payload associated with the operation performed on the memory device,
   wherein when the remaining payload meets a predefined requirement the memory controller sets the current total payload associated with the current temperature of the memory device.

14. The memory system of claim 13, further comprising:
   a timer coupled to the memory controller, the timer being configured to count a predefined amount of time,
   wherein the memory controller is further configured to control the timer to start counting the predefined amount of time when setting the current total payload associated with the current temperature of the memory device, and
   when the remaining payload meets the predefined requirement, the memory controller sets the current total payload associated with the current temperature of the memory device when the predefined amount of time is elapsed, or stops transferring data to and/or from the memory device until the predefined amount of time is elapsed and sets the current total payload associated with the current temperature of the memory device and controls the timer to start counting the predefined amount of time.

15. The memory system of claim 14, wherein the memory controller is further configured to, when the remaining payload does not meet the predefined requirement, perform another operation on the memory device and calculate the remaining payload based on the current total payload and another payload associated with the another operation performed on the memory device when the predefined amount of time is not elapsed, or set the current total payload associated with the current temperature of the memory device and control the timer to start counting the predefined amount of time when the predefined amount of time is elapsed.

16. The memory system of claim 13, wherein the memory controller calculates the remaining payload by subtracting from the current total payload the payload associated with the operation performed on the memory device.

17. The memory system of claim 13, wherein the memory controller sets the current total payload associated with the current temperature of the memory device based on a temperature range-current total payload relation.

18. The memory system of claim 13, wherein the predefined requirement requires that the remaining payload is less than zero.

19. The memory system of claim 13, wherein the memory device includes an memory cell of single-level cells (SLCs) or multi-level cells (MLCs) that are programmable to assume a plurality of nominal storage values.

20. The memory system of claim 19, wherein the operation comprises a single-level cell (SLC) read operation, an SLC write operation, an SLC erase operation, a multi-level cell (MLC) read operation, a MLC write operation or a MLC erase operation.

* * * * *